United States Patent [19]
Pu et al.

[11] Patent Number: 5,674,321
[45] Date of Patent: Oct. 7, 1997

[54] METHOD AND APPARATUS FOR PRODUCING PLASMA UNIFORMITY IN A MAGNETIC FIELD-ENHANCED PLASMA REACTOR

[75] Inventors: Bryan Pu; Hongching Shan, both of San Jose, Calif.

[73] Assignee: Applied Materials, Inc., Santa Clara, Calif.

[21] Appl. No.: 431,178

[22] Filed: Apr. 28, 1995

[51] Int. Cl.⁶ .................................................. C23C 16/00
[52] U.S. Cl. .......................... 118/723 MR; 118/723 MA; 427/571
[58] Field of Search .................. 118/723 MR, 723 MA, 118/723 E, 723 ER; 204/298.16, 298.2, 298.72, 298.37; 427/571

[56] References Cited

U.S. PATENT DOCUMENTS

| | | | |
|---|---|---|---|
| 4,740,268 | 4/1988 | Bukhman | 156/643 |
| 4,842,683 | 6/1989 | Cheng et al. | 156/345 |
| 4,963,242 | 10/1990 | Sato et al. | 204/298.31 |
| 5,061,838 | 10/1991 | Lane et al. | 219/121.59 |
| 5,122,251 | 6/1992 | Campbell et al. | 204/298.06 |
| 5,208,512 | 5/1993 | Forster et al. | 315/111.41 |
| 5,211,825 | 5/1993 | Saito et al. | 204/192.32 |
| 5,215,619 | 6/1993 | Cheng et al. | 156/345 |
| 5,225,024 | 7/1993 | Hanley et al. | 156/345 |
| 5,308,417 | 5/1994 | Groechel et al. | 156/643 |

*Primary Examiner*—John Niebling
*Assistant Examiner*—Joni Y. Chang
*Attorney, Agent, or Firm*—Thomason & Moser

[57] ABSTRACT

A magnetic field enhanced plasma etch reactor system for generating a radially-directed magnetic field within a reaction chamber. The reactor system comprises a reaction chamber for containing a plasma and a plurality of electromagnetic coils disposed about a reaction region within the reaction chamber. When each coil is driven with a current of similar magnitude, the electromagnetic coils produce a radially-directed magnetic field within the reaction chamber. The radially-directed magnetic field uniformly distributes the plasma throughout a bulk plasma region. Consequently, a substrate that is etched by such a uniform plasma has an improved uniformity in the etch pattern on the substrate.

9 Claims, 5 Drawing Sheets

METHOD AND APPARATUS FOR PRODUCING PLASMA UNIFORMITY IN A MAGNETIC FIELD-ENHANCED PLASMA REACTOR

BACKGROUND OF THE INVENTION

1. Field of the Invention

The present invention relates to a magnetic field-enhanced plasma etch reactor and, more particularly, to a method and apparatus for producing plasma uniformity in a magnetic field enhanced plasma reactor that results in reduced plasma induced substrate damage.

2. Description of the Background Art

Magnetic field-enhanced plasma etch reactors for plasma etching of a substrate are well known in the art. Plasma-based reactions have become increasingly important to the semiconductor industry, providing for precisely controlled thin-film depositions and etches. A plasma reactor generally comprises a reaction chamber for containing a reactant gas, a pair of spaced-apart electrodes (cathode and anode) driven by electric energy at radio frequencies to generate an electric field within the chamber, and a substrate support for supporting a substrate within the electric field. The cathode is typically embedded within the substrate support. The electric field ionizes the reactant gas to produce a plasma. The plasma, characterized by a visible glow, is a mixture of positive and negative ions and electrons. The positive ions are pushed outward by mutual repulsion toward surfaces of the reaction chamber and are electrically attracted toward the cathode since the cathode typically is negatively self-biased with respect to the ion charge. As such, the substrate, supported just above the cathode, is bombarded by positive ions which, depending upon the composition of the plasma, can form a deposited layer on the substrate or cause the substrate material to be etched.

Additionally, in such reactors, a magnetic field is generated within the reaction chamber to control the motion of the electrons within the plasma, i.e., to confine free electrons to a bulk plasma region centrally located in the reaction chamber. In general, one or more electromagnets are positioned about the circumference of the reaction chamber to generate a magnetic field perpendicular to the electric field within the chamber and parallel to the surface of the cathode. In particular, the magnetic field is perpendicular to the electric field within a cathode plasma sheath that forms during plasma generation proximate the surface of the cathode. Such positioning of the magnetic field confines a substantial quantity of electrons to a region within the plasma that is proximate the cathode plasma sheath. As such, the increased number of electrons at that location enhances the plasma density proximate the cathode sheath and the substrate. The dense plasma is usually located at an "east" side of the magnetic field lines due to what is commonly referred to as the $\vec{E} \times \vec{B}$ drift. As such, the plasma is not uniform. Consequently, the enhanced density plasma produces a higher etch rate in an area of the substrate that is proximate the denser plasma.

In an attempt to produce uniform etching of the substrate by uniformly distributing the plasma, etch reactors commonly employ a rotating magnetic field to uniformly distribute plasma density differences. Such a rotating magnetic field is generated using two pairs of electromagnetic coils located on opposite sides of the reaction chamber. The coils in each coil pair are coaxially aligned with one another. Current flowing in one pair of coils produces a magnetic field perpendicular to the magnetic field produced by a current flowing in the other pair of coils, i.e., the current flows in opposite directions through adjacent coils. When the pairs of coils are driven by sinusoidal currents that are 90 degrees out of phase, the coils create a rotating magnetic field parallel to the upper surface of the substrate in the reaction chamber.

Even with plasma reactors employing such a rotating magnetic field, non-uniform plasma densities and etch rates may persist and substrates processed in such reactors may exhibit undesirable non-uniform etch patterns. In particular, on the substrates processed by such magnetic field-enhanced plasma reactors, plasma non-uniformities and differences may occur in particular regions such as the four corner regions of the upper surface of the substrate that lie between adjacent electromagnets. This phenomenon is known as the "focusing effect" and it results in substrate damage in the particular regions affected by the focusing effect. In addition, electrical components on such substrates can be subject to "charge up" damage due to non-uniform plasma density. Further, such non-uniform plasma densities may result in (i) differences in "selectivity" of etch rate on the substrate, (ii) differences in residue deposit distribution on the substrate, and (iii) differences in corrosion or erosion on the substrate. Such non-uniformities and differences also may be found on the surfaces of the hardware comprising such reactors including the reactor chamber surfaces, gas distribution plate, cathode pedestal components and so on.

A unique reactor system having the capability of instantaneously and selectively altering the magnetic field strength and direction is described in commonly assigned U.S. Pat. No. 4,842,683 issued Jun. 27, 1989 and entitled "Magnetic Field-Enhanced Plasma Etch Reactor." The patent is incorporated herein by this reference both for completeness of the description of the background of this invention and also for completeness of the detailed description hereinafter set forth. The unique magnetic field-enhanced reactor described in the patent improves the uniformity of the resulting etch patterns on substrates processed by the reactor.

Despite the improvements represented by the above-referenced patent, some non-uniform plasma density and etch rates still may persist and the resulting etch patterns still may exhibit non-uniformities of about 6% or more where non-uniformity is defined as the maximum etch rate minus the minimum etch rate divided by twice the average etch rate over the entire area of the etched surface of the substrate.

Another effort to improve plasma uniformity is disclosed in commonly assigned U.S. patent application Ser. No. 08/069,049 filed May 28, 1993, and entitled "Method and Apparatus For Altering Magnetic Coil Current to Produce Etch Uniformity in a Magnetic Field-Enhanced Plasma Reactor." This application is incorporated herein by reference. This unique magnetic field-enhanced plasma reactor improves plasma uniformity by modulating the currents applied to the coil pairs. In response to the modulated currents, the rotation speed and magnitude of the magnetic field is modulated to alter the magnetic field at particular regions where the focusing effect is most prevalent, i.e., the four corners where the individual coils meet one another. Although this unique reactor does improve plasma uniformity, some non-uniformity persists in the corners of the reactor. Consequently, substrate damage from the focusing effect still may occur. Furthermore, such plasma modulation produces an unstable plasma that results in a some amount of reflected radio frequency (RF) power. Such power reflection results from the RF matching network being incapable of tracking the plasma modulation and maintain an impedance match for the modulated plasma. The impedance mismatch results even when complex adaptive matching networks are utilized. Without a sufficient impedance match, some amount of the RF power used to drive the cathode is reflected from the reaction chamber back into the RF power supply. Consequently, the efficiency of the plasma generation process is compromised which can, if the impedance mismatch is sufficiently poor, result in the cessation of plasma generation or damage to the RF power supply.

Another effort to improve plasma uniformity is disclosed in commonly assigned U.S. Pat. No. 5,225,024 issued Jul. 6, 1993 and entitled "Magnetically Enhanced Plasma Reactor System for Semiconductor Processing". This patent is incorporated herein by reference. This unique magnetic field-enhanced plasma reactor improves plasma uniformity by using two electromagnetic coils that are aligned parallel to the cathode surface and are coaxially aligned with one another along a central axis that extends vertically through the center of the reaction chamber. Additionally, one coil is positioned below a plane of the cathode surface and the other coil is positioned above the plane of the cathode surface. As such, the interaction of the magnetic fields from both coils forms a magnetic mirror having a radially directed, axisymmetric magnetic field. This magnetic mirror substantially confines the electrons within the plasma to a region proximate to the cathode plasma sheath and centered on the central axis of the chamber. In other words, the magnetic mirror focuses the plasma into a central region just above the cathode plasma sheath. Such a radially directed magnetic field produces an $\vec{E} \times \vec{B}$ drift pattern that is azimuthal about the central axis. In this manner, the electrons tend to drift along a circular path above the substrate without inducing substantially any conventional, corner plasma focusing effect. Although the corner focusing effect is substantially eliminated, to achieve a magnetic mirror, the '024 patent teaches focusing the plasma into a central region above the cathode plasma sheath. As a result, the plasma tends not to be uniform and may cause focusing effect damage to the center of the substrate.

Furthermore, to enhance the magnetic mirror, the '024 patent further teaches positioning a permanent magnet at a central location within the substrate support. This permanent magnet further contributes a magnetic field to the central region above the cathode plasma sheath to enhance the plasma focusing effect at the center of the substrate. In sum, the reactor system taught in the '024 patent substantially eliminates the corner focusing effect attributed to the conventional reactor systems discussed above, but the '024 reactor system causes a focusing effect at the center of the substrate.

The prior art teaches reactor systems that improve plasma uniformity; however, each system has certain detrimental non-uniformities remaining in the plasma. Therefore, there is a continuing need to provide a magnetic field-enhanced plasma etch reactor that generates uniform plasma densities. The present invention satisfies such a requirement.

SUMMARY OF THE INVENTION

The present invention achieves the foregoing objective by addressing the root cause of the plasma enhancement non-uniformity provided by a rotating magnetic field. In this regard, the present invention provides apparatus for selectively controlling the degree of plasma enhancement using a radially-directed magnetic field in a magnetic field-enhanced plasma reactor.

Specifically, a first aspect of the present invention comprises a reaction chamber containing a substrate support and a reactant gas to facilitate formation of a plasma within the chamber proximate the substrate support. The chamber has positioned on each of its four sides a magnetic coil such that the coils are disposed about a periphery of a reaction region within the chamber. In this arrangement, coils located at opposing sides of the chamber form a coil pair. Each coil in each of the coil pairs is connected in series to one another. Each coil pair is driven with either an AC or DC current of substantially similar magnitude and polarity, i.e., the current in each pair of coils flows in the same direction with respect to one another.

When such coils are driven in this manner, a combination of the magnetic fields generated by each of the coil pairs produces a resultant radially-directed magnetic field emanating from a center axis of the reaction chamber. As such, the $\vec{E} \times \vec{B}$ drift forms a circular pattern that is parallel to the surface of the substrate support. With such an $\vec{E} \times \vec{B}$ drift pattern and a radially-directed magnetic field, there is substantially no focusing of the magnetic field and, consequently, the plasma is substantially uniform throughout the reaction chamber.

A second aspect of the present invention comprises a reaction chamber containing a substrate support and a reactant gas to facilitate formation of a plasma within the chamber proximate to the substrate support. The chamber has positioned about its circumference a plurality of electromagnetic coils such that the coils circumscribe a periphery of a reaction region within the chamber. Each coil is parallel to the surface of the substrate support and is coaxially aligned with each other coil in the plurality of coils. A first coil is positioned below a plane defined by the surface of the substrate support. A plurality of coils (e.g., second, third, and fourth coils) are positioned above the plane defined by the surface of the substrate support. Each coil is driven with either an AC or DC current of substantially similar magnitude. Furthermore, the current flowing in each coil flows in an opposite direction with respect to the next adjacent coil(s), e.g., the current flows counter-clockwise in the first coil, clockwise in the second coil, counter-clockwise in the third coil, and so on.

When such coils are driven with current in this manner, a combination of the magnetic fields generated by each of the coils produces a resultant radially-directed magnetic field emanating from a center axis of the reaction chamber and distributed vertically throughout the plasma, i.e., each of the plurality of magnets generates an individual, radially-directed magnetic field at a different location within the plasma. Magnetic fields produced by adjacent coils constructively interfere with one another within planar regions between the coils such that the plasma is enhanced in layers throughout the vertical extent of the bulk plasma region. Since the resultant magnetic fields are radially-directed, the $\vec{E} \times \vec{B}$ drift throughout the plasma forms a circular pattern that is parallel to the surface of the substrate support. With such an $\vec{E} \times \vec{B}$ drift pattern and multiple, radially-directed magnetic fields, there is substantially no focusing of the magnetic field and, consequently, the plasma is substantially uniform throughout the reaction chamber. In effect, the stacked arrangement of coils produces a "defocused" or distributed radially-directed magnetic field.

Consequently, the present invention substantially improves plasma uniformity, increases the degree of plasma enhancement, and reduces plasma focusing effect that causes substrate damage. Both aspects of the present invention produce a radially-directed magnetic field that eliminates corner focusing of the plasma. Moreover, both aspects of the invention produce stable magnetic fields and, therefore, they do not require any adaptive RF matching networks to couple the RF energy to the plasma. Additionally, the second aspect of the invention produces multiple, radially-directed magnetic fields from a plurality of coaxially aligned, stacked coils to substantially eliminate central focusing of the plasma.

BRIEF DESCRIPTION OF THE DRAWINGS

The teaching of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The above-referenced U.S. Pat. No. 4,842,683, incorporated by reference herein, describes a reactor system similar to that shown in FIGS. 1, 2 and 4 hereof. The reactor system of the present invention is distinct from prior art rotating magnetic field plasma reactors which typically rotate a resultant magnetic field. Rather, in the reactor of the present invention, the magnitude of the resultant magnetic field is stable and its direction is radial, i.e., the resultant magnetic field emanates from the center of the reaction chamber.

Figure 1:
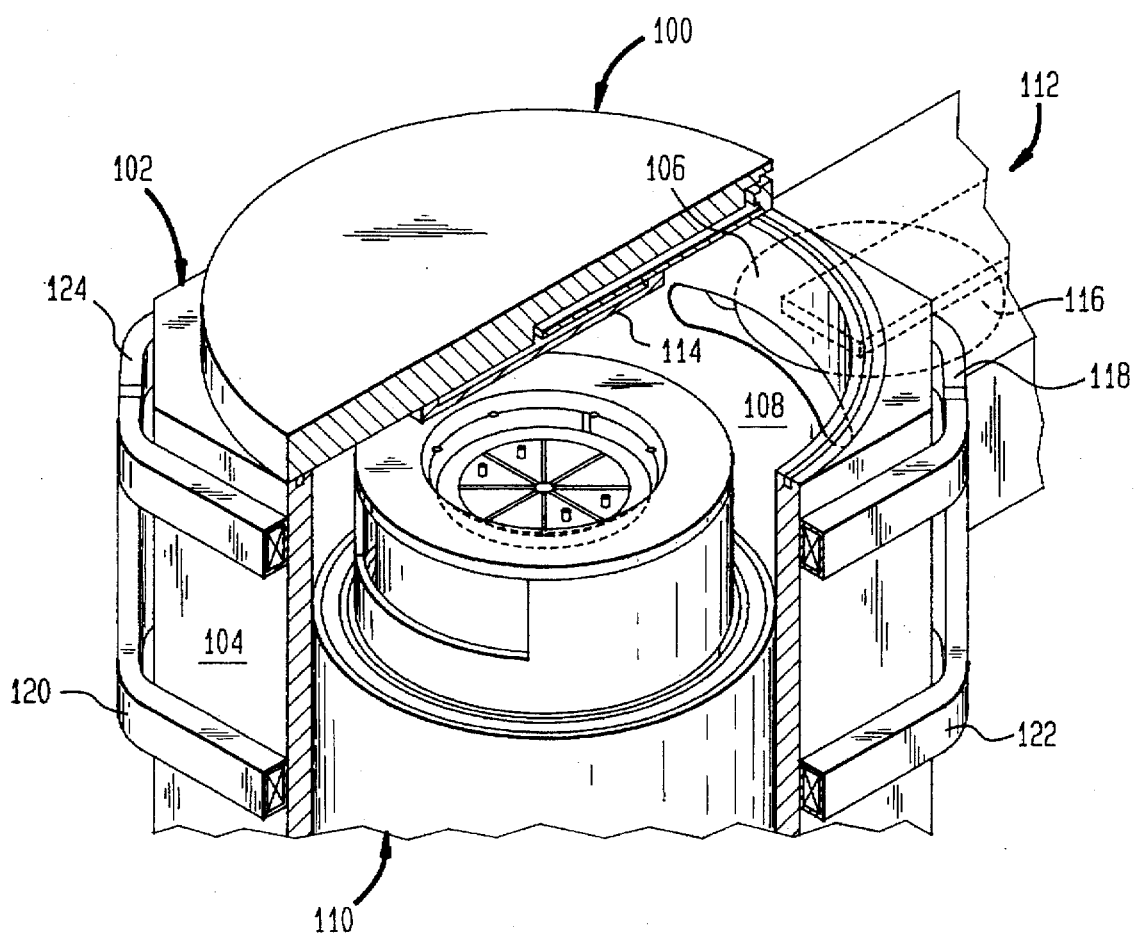
FIG. 1 is an isometric view partially cut away of the structure of a magnetic field-enhanced plasma reactor incorporating a first aspect of the present invention.
Figure 2:
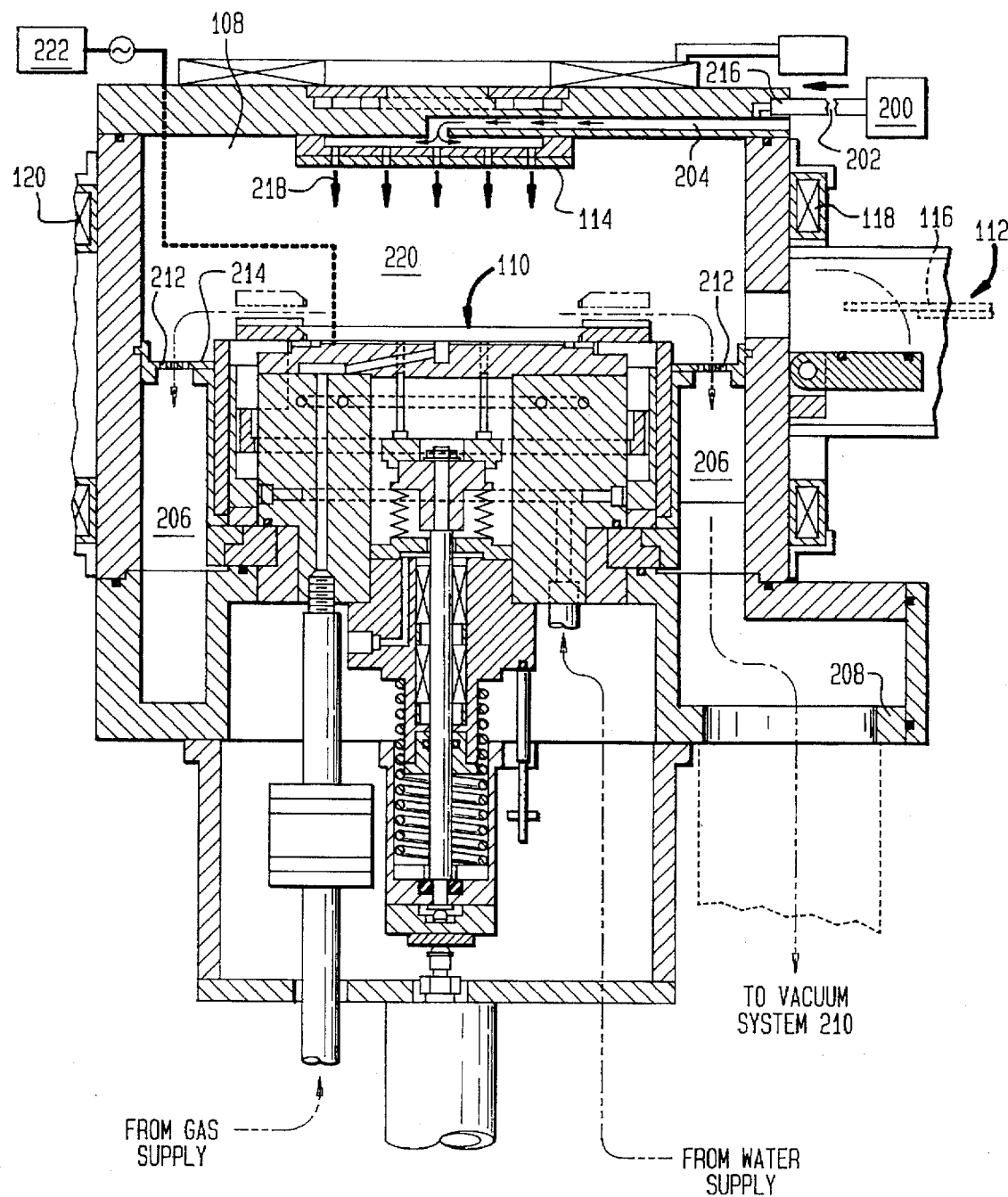
FIG. 2 is a vertical cross-section partially in schematic of the reactor shown in FIG. 1.

Specifically, the reactor system 100 depicted in FIGS. 1 and 2 comprises a housing 102 having octagon-shaped outer walls 104 and a circular inner wall 106 defining a reaction chamber 108. The system also includes a gas and liquid cooled pedestal/cathode assembly 110 and a wafer (substrate) exchange system 112. The wafer exchange system 112 cooperates with the pedestal assembly 110 to facilitate positioning a substrate 116 upon assembly 110 and removing the substrate 116 from the chamber 108 after etching.

Process gases are supplied to the interior of the chamber 108 by a gas manifold 114 from a gas supply system 200. The gas supply system 200 communicates with the manifold 114 and chamber 108 via supply lines 202 and conduit 204.

Vacuum is supplied to the chamber and spent gases are exhausted via annular exhaust chamber 206 communicating with exhaust port 208 connected to a vacuum pumping system 210. The exhaust flow is directed from the chamber 108 through holes 212 in a horizontal annular plate 214 mounted about the upper periphery of the cathode assembly 110. The plate 214 inhibits plasma penetration into the annular exhaust chamber 206.

Conduit 204 routes a reactant gas such as carbon tetrafluoride ($CF_4$) from inlet 216 into manifold 114. The gas exits the manifold downwardly (as indicated by arrows 218). When RF power is applied to the cathode assembly 110 an etching plasma is formed in chamber processing region 220. An RF power supply system 222 supplies RF power to the reactor system 100 to generate the plasma.

To control the plasma, the reactor system 100 further includes a number of paired electromagnets 118, 120, 122 and 124, typically comprising copper coils, mounted in a rectangular array, one each on alternating outer walls of the octagon-shaped housing 104. As such, adjacent coils are substantially orthogonal to one another. Each coil is substantially rectangular in shape, having opposing upper and lower portions as well as opposing left and right portions that, taken together, define an opening within the rectangular shape of the coils. Each coil is fabricated of 310 turns of 14 gauge insulated, copper wire.

The array of four coils located about the periphery of the chamber places the left portion of each coil adjacent to the right portion of a neighboring coil. The ends of the upper and lower portions of the coils are turned inwardly toward the reaction chamber (by approximately 45 degrees) to substantially match the shape of the octagon-shaped housing.

The remaining component parts of the reactor system depicted in FIGS. 1 and 2 form an operational reactor system in which the present invention is incorporated. A full discussion of all the component parts is presented in commonly assigned U.S. Pat. No. 4,842,683 discussed above and incorporated herein by reference.

Figure 3:
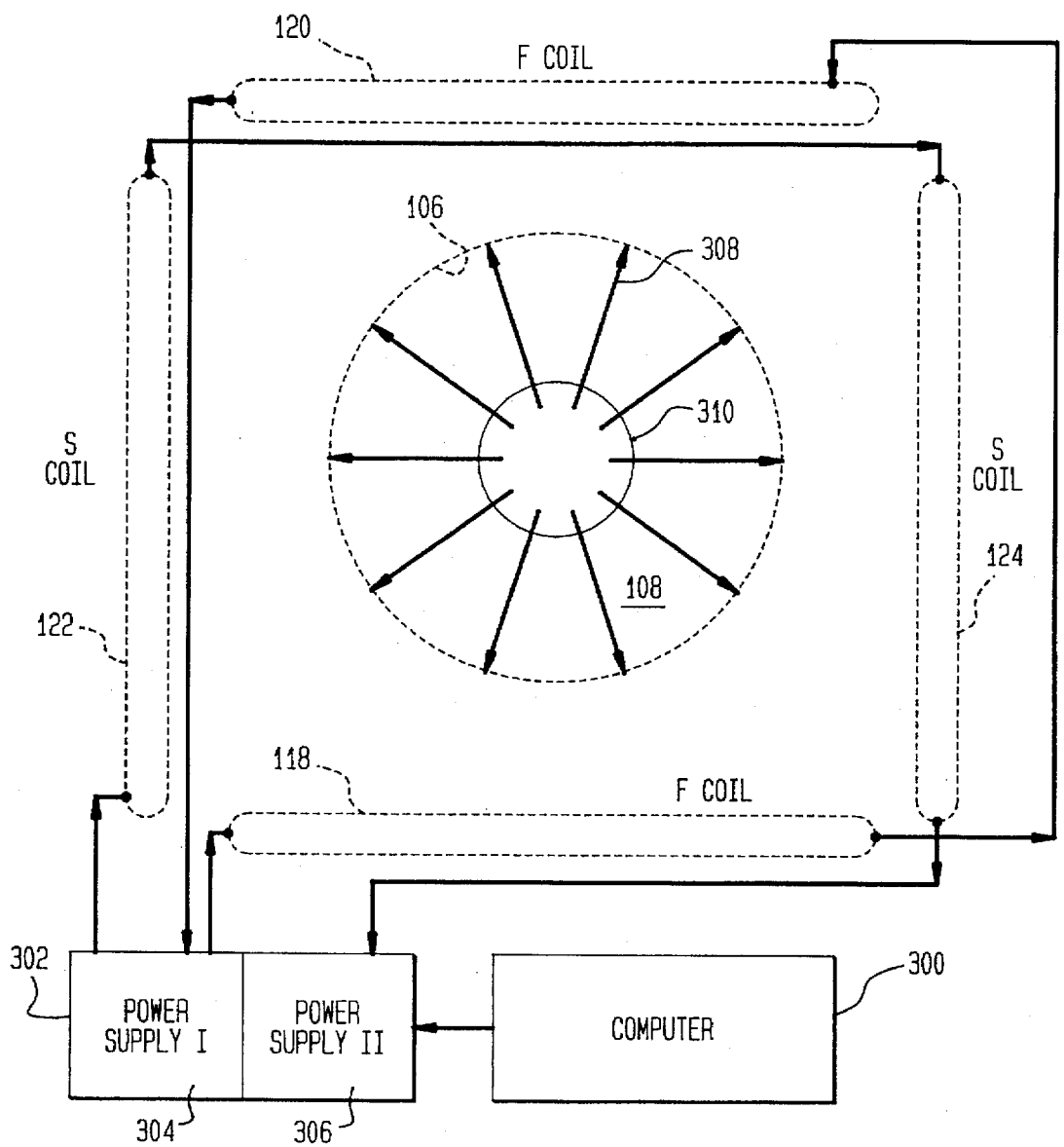
FIG. 3 is a schematic representation of the first aspect of the present invention shown in FIG. 1.

As depicted in FIG. 3, a computer 300 is utilized to control the current that is applied to the electromagnets by power supply system 302. Such current control regulates the magnitude and direction (polarity) of the currents supplied to the electromagnets, the magnitude of the magnetic fields generated by the electromagnets and a resultant magnetic field vector formed by the combined magnetic fields generated by each of the electromagnets. Specifically, the electromagnetic coils are arranged as two pairs of coils. The so-called side coils (S coils 122 and 124) form a first pair of series connected coils, while the so-called front coils (F coils 118 and 120) form a second pair of series connected coils. Physically, the S coils are aligned with one another along a first axis and the F coils are aligned with one another along a second axis. The first and second axes are orthogonal to one another.

Each coil pair is connected to an independently controllable DC power supply 304 and 306. The computer 300 controls the current magnitude generated by each power supply. As such, the magnitude of the resultant magnetic field generated by the coils can be varied to select an etch rate and vary ion bombardment of the substrate.

An operator selects a particular current magnitude for each pair of series connected electromagnets 118–124 included in the reactor 100. Although the current to each pair of coils can be independently set, typically, the magnitude of the current through each of the pairs of coils are substantially similar. The selected electromagnet currents are those which the operator believes will produce a particular magnitude radially-directed magnetic field which, in turn, will produce a controlled enhancement of the plasma density and improved uniformity in etch rate. Such a uniform etch rate produces a uniform etch pattern over the entire upper surface of the processed substrate. The current magnitudes are typically selected from a menu or table of current magnitudes. In response, the computer retrieves an appropriate command signal from a current magnitude table. Such current magnitude tables are stored in the memory of the computer 300. The computer 300, for example, may comprise a 68010 processor as utilized in the system described in the previously referenced United States Patent.

The power supply system 302 applies the selected magnitude currents to the coils in the electromagnets while the reactor of FIGS. 1 and 2 processes a substrate or wafer. During such processing, the currents applied to the coils produce a radially-directed, static magnetic field that results in improved uniformity of the plasma over the surface of the wafer. The resultant magnetic field within the plasma is depicted in FIG. 3 as arrows 308.

More specifically, the power supply system 302 contains a two-channel power amplifier manufactured by Sierracin/Magnedyne of Carlsbad, Calif. This illustrative two-channel power amplifier is a switching amplifier capable of controlling the current in two separate inductive/resistive loads. Each channel is designed to provide up to 25 amps peak-to-peak in response to current commands from the computer 300. The power supply system produces a first current (S coil current) applied to the series connected S coils of electromagnets 122 and 124. The current flows through each S coil in the same direction (e.g., a clockwise direction). A second current (F coil current) having substantially the same magnitude as the first current is generated and applied to the series connected coils of the electromagnets 118 and 120. The second current flows through the F coils in the same direction as the current in the S coils, e.g. if the S coil current flows clockwise, the F coil current flows clockwise. Typically, both the F and S coil currents are approximately 20 to 25 amps.

When the coil pairs are driven with substantially equivalent DC currents, the resultant magnetic field within the chamber is parallel to the substrate support and radially-directed from the center of the chamber (shown as arrows 308). Since the drive currents are constant DC values, the resultant magnetic field is static and uniformly distributed throughout the chamber. Such a radially-directed magnetic field occurs because the magnetic fields produced by the right and left portions of each coil cancel one another in destructive combination, while the upper and lower portions produce magnetic fields that constructively combine within the bulk plasma region to form the resultant radially-directed magnetic field. (as shown by line 310). Consequently, by having a circular drift pattern, the invention virtually eliminates plasma focusing. Additionally, with a static magnetic field, the task of impedance matching the RF drive electronics to the plasma is simple, i.e., an adaptive or dynamic matching network is not necessary.

Alternatively, the computer may cause the power amplifiers to drive the coils with an AC current that flows, at any moment in time, in the same direction and with approximately the same magnitude through each of the coils. Simply stated, each of the coils are driven with substantially identical AC currents. Driving the coils in this manner generates an oscillatory radially-directed magnetic field. With a radially-directed magnetic field, whether the field is oscillatory (AC drive current) or not (DC drive current), the $\vec{E} \times \vec{B}$ drift pattern is circular and the resultant plasma is substantially uniform throughout the bulk plasma region.

Following the processing of the wafer, the etch pattern of the wafer is inspected for non-uniformities. If the inspection reveals that the etch pattern meets specifications for uniformity of etch, then the selected current magnitudes are established as the standard for future use in the mass production of wafers using the reactor system. If, on the other hand, the inspection reveals that the resulting etch pattern does not meet predetermined specifications for etch uniformity, a different current magnitude is selected and the etch process is repeated until the etch pattern of the processed wafer meets such specifications.

The present invention substantially improves the etch rate and reduces the damage caused by the focusing effect. Specifically, with the embodiments disclosed herein, the resulting etch pattern is subject to non-uniformities of about six percent (6%) or less with an etch rate improvement of approximately ten percent (10%) over the prior art.

Figure 4:
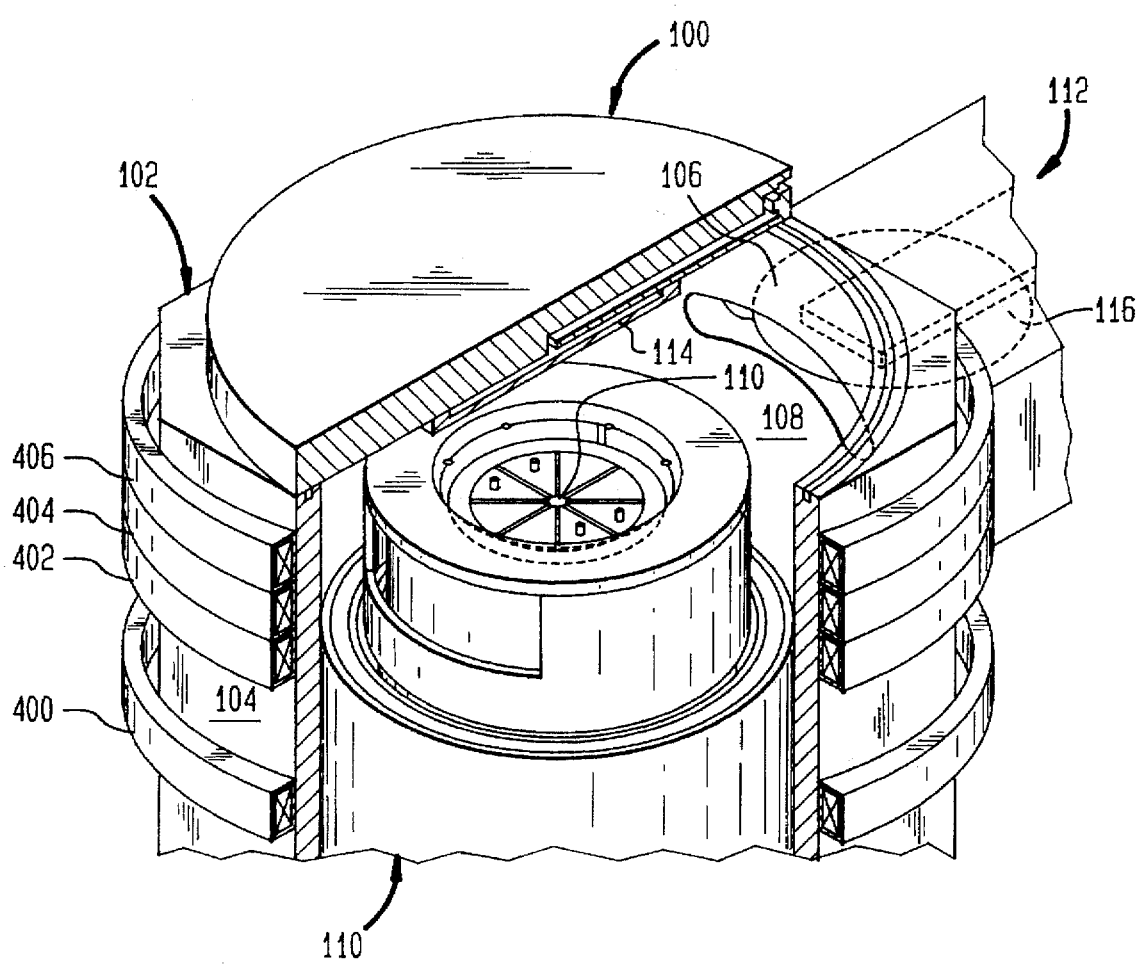
FIG. 4 is an isometric view partially cut away of the structure of a magnetic field-enhanced plasma reactor incorporating a second aspect of the present invention.

FIG. 4 depicts a second aspect of the present invention. The depicted reactor system is identical to that described with reference to FIGS. 1 and 2 above, except the structure of the magnetic coils are different in this second aspect. Specifically, in FIG. 4, a plurality of coils 400, 402, 403, and 404 surround the circumference of a reaction region in the reaction chamber 104. The coils could be positioned within the chamber or outside the chamber without significantly impacting the efficacy of the invention. Whether within the chamber or outside the chamber, the coils are substantially annular and are coaxially aligned with one another along a central axis that extends through the center of the chamber. Each coil is fabricated of 310 turns of 14 gauge insulated copper wire.

A first coil 400 is located below a plane defined by the surface of the substrate support 110 that is used to support a substrate within the chamber. The second, third and fourth coils 402, 404, and 406 are stacked respectively one atop the other in a location above the plane defined by the surface of the substrate support 110. Although one lower coil (first coil 400) and three upper coils (first, second and third coils 402, 404, and 406) are depicted as an illustrative aspect of the invention, any number of upper and lower coils in any combination should be considered within the scope of the invention.

Figure 5:
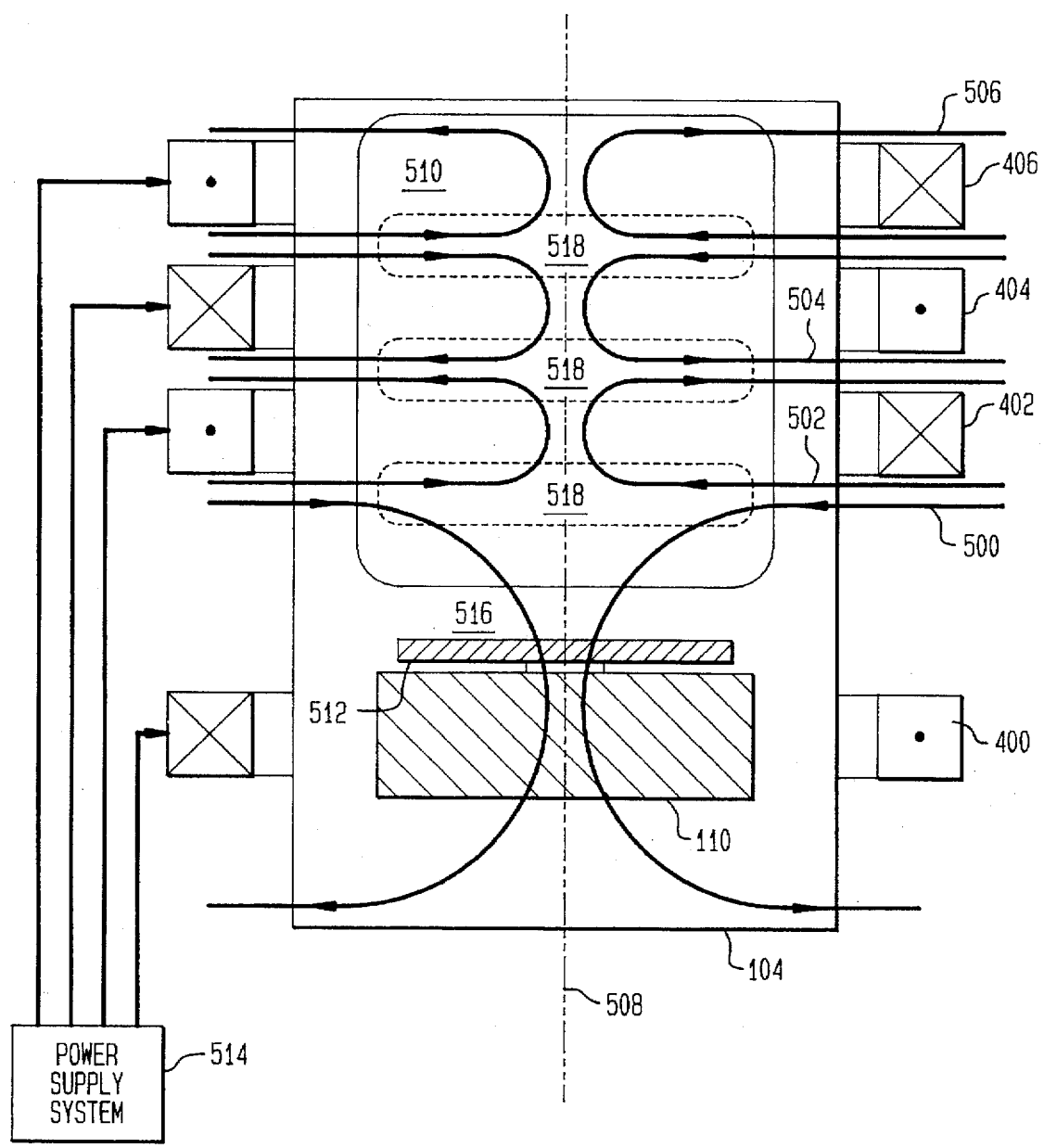
FIG. 5 depicts a schematic representation of the second aspect of the present invention shown in FIG. 4.

FIG. 5 is a schematic representation of the reaction chamber 104 and coils 400, 402, 404, and 406 shown in FIG. 4. In operation, power supply system 514 drives each of the coils with substantially identical magnitude currents. Each current has an opposite polarity to the current flowing in each neighboring coil. The power supply system 514 contains two of the power supplies discussed with respect to FIG. 4 above. Thus, the power supply system 514 of FIG. 5 contains two switching power amplifiers that are capable of independently driving each coil with up to 25 amps of AC or DC current.

Lower coil 400 is, for example, driven with a clockwise directed DC current, while upper coil 402 is driven with a counter-clockwise directed DC current, upper coil 404 is driven with a clockwise directed DC current and upper coil 406 is driven with a counter-clockwise directed DC current. As such, coil 400 produces magnetic field 500, coil 402 produces magnetic field 502, coil 404 produces magnetic field 504 and coil 406 produces magnetic field 506. Within the bulk plasma region 510, the magnetic fields extend radially from a central axis 508 of the chamber 104, i.e., the fields are axi-symmetric. The magnetic fields of adjacent coils constructively interfere in planar regions 518 located between the coils. In these planar regions, the plasma is enhanced by the increased magnitude of the radially-directed magnetic fields. Also, these planar regions lie substantially parallel to the plane defined by the substrate support surface 512. Field 500, which is directed in the same direction as field 502, ensures that a magnetic field enhanced region 518 is located just above the cathode plasma sheath 516 and is substantially parallel-to the surface of the substrate support 110.

Importantly, the planar regions 518 provide layers of plasma enhancement throughout the vertical extent of the bulk plasma region 510. Consequently, to avoid plasma focusing in the central portion of the plasma, the stacked upper coils produce radially-directed magnetic fields distributed throughout the vertical dimension of the plasma, i.e., the fields are defocused. As such, the more upper coils that are used, the more planar region layers are produced, and the greater the uniformity of the magnetic fields throughout the bulk plasma region resulting in a substantially uniformly enhanced plasma.

Since each coil is driven with its own, individual drive current, the plasma uniformity is optimized by altering the relative magnitudes of the currents flowing in the coils. Such current adjustment alters the degree of plasma enhancement in each planar region permitting optimization of the plasma density and enhancement.

Although the second aspect was specifically discussed above as using DC current to drive each of the coils; alternatively, an AC current is used. With an AC current, each adjacent coil is typically driven with a current of similar magnitude and a 180 degree phase shift, i.e., at any point in time, the current in adjacent coils flows in opposite directions. The vertically distributed planar regions 518 of enhanced plasma are generated by oscillating, radially-directed magnetic fields located between adjacent coils. As such, the same uniform plasma that was generated by DC current is also generated by AC current. Furthermore, to optimize the plasma density and enhancement, the relative phase, frequency and magnitude of the AC currents flowing in the various coils can be adjusted.

To summarize, the present invention substantially improves plasma uniformity and, in particular, substantially reduces plasma focusing effects that cause substrate damage. In particular, both aspects of the present invention produce a radially-directed magnetic field that eliminates corner focusing of the plasma. Moreover, when driven with DC current, both aspects of the invention produce stable, time-invariant plasmas that eliminate any requirement for an adaptive RF matching network. Furthermore, the second aspect of the invention produces multiple, radially-directed magnetic fields from a plurality of coaxially aligned, stacked coils to substantially eliminate central focusing of the plasma. As such, both aspects of the present invention generate superior plasma uniformity to that which has heretofore been achieved by prior art plasma etch reactor systems.

Although various embodiments which incorporate the teachings of the present invention have been shown and described in detail herein, those skilled in the art can readily devise many other varied embodiments that still incorporate these teachings.

What is claimed is:

1. A magnetic field-enhanced plasma reactor comprising:

a reaction chamber for containing a plasma proximate a substrate support;

a plurality of substantially annular electromagnets circumscribing a reaction region within the reaction chamber for forming a radially-directed magnetic field within the reaction chamber wherein at least one of said plurality of electromagnets is below the substrate support and a remaining number of electromagnets are above the substrate support, coaxially aligned, and stacked one on top of the other; and a current generator, connected to said plurality of electromagnets, for applying a current to each electromagnet in said plurality of electromagnets, where each of the currents flow in opposite directions through adjacent electromagnets.

2. The reactor of claim 1 wherein the current flowing in each electromagnet is a DC current.

3. The reactor of claim 1 wherein the current flowing in each electromagnet is a AC current.

4. The reactor of claim 1 wherein said substrate support has a surface that defines a plane wherein one of said plurality of substantially annular electromagnets is positioned below the plane and three substantially annular electromagnets in said plurality of substantially annular electromagnets are coaxially aligned, and stacked one on top of the other.

5. In a magnetic field-enhanced plasma reactor having a plurality of electromagnets circumscribing a reaction region within a reaction chamber wherein at least one of said plurality of electromagnets is below a substrate support and a remaining number of electromagnets are above the substrate support, coaxially aligned, and stacked one on top of the other, a method comprising the steps of:

applying a current to each of said electromagnets in said plurality of electromagnets, where each of said currents flow in opposite directions through adjacent electromagnets; and generating a radially directed magnetic field within said reaction chamber.

6. The method of claim 5 wherein said generating step further comprises the step of generating planar regions of enhanced plasma located between adjacent electromagnets.

7. The method of claim 5 wherein said current is an AC current.

8. The method of claim 5 wherein said current is a DC current.

9. The method of claim 5 wherein said currents flowing in each of said electromagnets have substantially similar magnitudes.

* * * * *